United States Patent [19]
Nagashima

[11] Patent Number: 5,432,485
[45] Date of Patent: Jul. 11, 1995

[54] CIRCUIT FOR CROSSING STRIP LINES
[75] Inventor: Katsuya Nagashima, Tokyo, Japan
[73] Assignee: NEC Corporation, Tokyo, Japan
[21] Appl. No.: 278,162
[22] Filed: Jul. 21, 1994
[30] Foreign Application Priority Data
  Jul. 23, 1993 [JP] Japan .................................. 5-202078
[51] Int. Cl.6 .............................................. H01P 5/12
[52] U.S. Cl. .................................. 333/1; 333/246
[58] Field of Search .................... 333/1, 116, 120, 127, 333/128, 246, 115

[56] References Cited
U.S. PATENT DOCUMENTS
  4,525,690  6/1985  De Ronde ............................ 333/116
  5,304,961  4/1994  Dydyk ............................ 333/116 X FOREIGN PATENT DOCUMENTS
  86302      5/1984   Japan .................................. 333/246
  63-308999 12/1988   Japan .
  3-129895   6/1991   Japan .

Primary Examiner—Paul Gensler
Attorney, Agent, or Firm—Ostrolenk, Faber, Gerb & Soffen

[57] ABSTRACT

A cross circuit comprises a lattice structure formed on a single layer of a multilayer printed circuit, the lattice structure having an arrangement of nodes consisting of two input nodes, two output nodes, a center node and four other nodes which are connected by quarter-wavelength lines. An input node is connected to both a first node and a second node by a quarter-wavelength line, and the other input node is connected to both the first node and a third node by a quarter-wavelength line. Similarly, an output node is connected to both the third node and a fourth node, the other output node to both the fourth node and the second node, the center node to the four nodes, by quarter-wavelength lines, respectively. A first input signal of a predetermined frequency applied to the first input node appears on only the first output node, and the second input signal of the same frequency applied to the second input node appears on only the second output node.

6 Claims, 5 Drawing Sheets

_(1)_
CIRCUIT FOR CROSSING STRIP LINES

BACKGROUND OF THE INVENTION

1. Field of the Invention

The present invention relates to a strip line cross circuit and, more particularly, to an improvement of a circuit for crossing strip lines on a multilayer printed circuit employed in, for example, portable equipment such as a portable telephone set.

2. Description of the Prior Art

Generally, multilayer printed circuit boards have been employed in high-frequency circuits of portable telephone sets. A multilayer printed circuit board can be provided with mounting patterns on the upper and lower surfaces and wiring patterns on inner layers, which has contributed greatly to making the size of the high-frequency circuit smaller (Japanese Patent Unexamined Publication Nos. Sho 63-308999 and Hei 3-129895).

In such a multilayer printed circuit board, when strip lines are placed across each other, a two-level crossing is required wherein the lines are crossed with a space so that they are not coupled electromagnetically with each other.

FIG. 1 schematically shows a conventional cross circuit of inner layer strip lines. When two lines 101 and 102 are crossed on a certain layer L1, the line 101 is connected to a line 105 on a different layer L2 by through holes 103 and 104 so that one line is not coupled to the other, as shown in the figure. That is, in the conventional cross circuit, there was adopted a two-level crossing structure wherein one line 101 bypasses the other line 102 to a lower or upper layer.

Such a conventional structure, however, causes the increased number of layers of a multilayer printed circuit board and the decreased wiring area on the lower layer L2. Moreover, since one inner layer strip line is arranged up and down over two or more layers, the route becomes complicated and the wiring difficult.

It is, accordingly, an object of the present invention to provide a cross circuit which is capable of facilitating the wiring of a multilayer printed circuit and reducing the number of layers.

SUMMARY OF THE INVENTION

A cross circuit in accordance with the present invention is comprised of a lattice structure formed on a single layer of a multilayer printed circuit, the lattice structure having an arrangement of nodes consisting of two input nodes, two output nodes, a center node, and four other nodes which are connected by quarter-wavelength lines. A first input signal of a predetermined frequency applied to a first input node appears on only a first output node, and a second input signal of the same frequency applied to a second input node appears on only a second output node.

More specifically, the first input node and a first node are connected by a quarter-wavelength line, and the first node and the second input node are connected by a quarter-wavelength line. The first input node and a second node are connected by a quarter wavelength line, and the second node and the second output node are connected by a quarter wavelength line. The second input node and a third node are connected by a quarter wavelength line, and the third node and the first output node are connected by a quarter wavelength line. The first output node and a fourth node are connected by a quarter wavelength line, and the fourth node and the second output node are connected by a quarter wavelength line. The first node and a fifth node are connected by a quarter wavelength line, and the fifth node and the fourth node are connected by a quarter wavelength line. The second node and the fifth node are connected by a quarter wavelength line, and the fifth node and the third node are connected by a quarter wavelength line.

The first input signal applied to the first input node appears on only the first output node, and the second input signal applied to the second input node appears on only the second output node.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENTS

Figure 1:
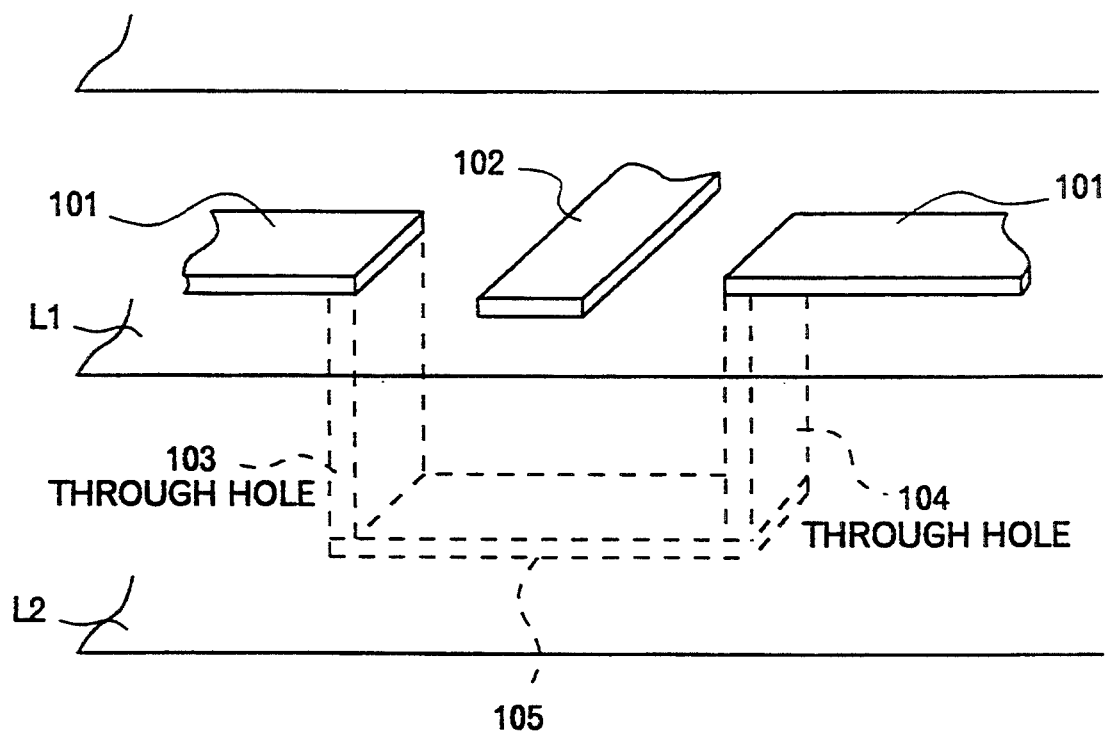
FIG. 1 is a perspective view showing a conventional cross circuit of an inner layer strip line.
Figure 2:
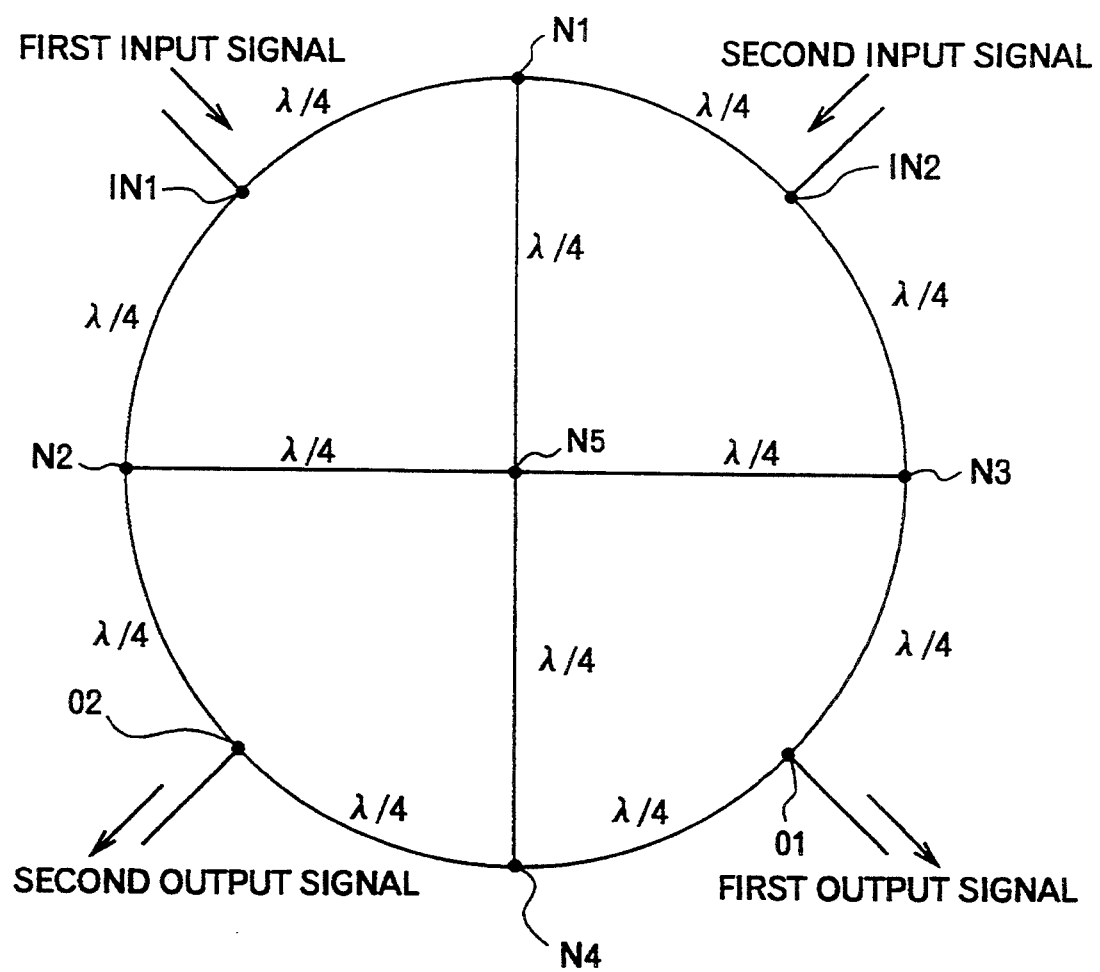
FIG. 2 is a schematic diagram showing a circuit pattern of a cross circuit according to an embodiment of the present invention.

Referring to FIG. 2, there is shown a preferred embodiment of a cross circuit in accordance with the present invention. Any two nodes adjacent to each other are interconnected through a quarter-wavelength line. More particularly, a first input node IN1 to which a first input signal is applied is connected with both a first node N1 and a second node N2 each through a quarter-wavelength line. The first node N1 is further connected with both a second input node IN2 and a fifth node N5 by respective quarter-wavelength lines. Similarly, the second node N2 is connected with both a second output node O2 and the fifth node N5, the fifth node N5 with a third node N3 and a fourth node N4, the third node N3 with the second input node IN2 and a first output node O1, and the fourth node N4 with the second output node O2 and the first output node O1, through respective quarter-wavelength lines.

Figure 3:
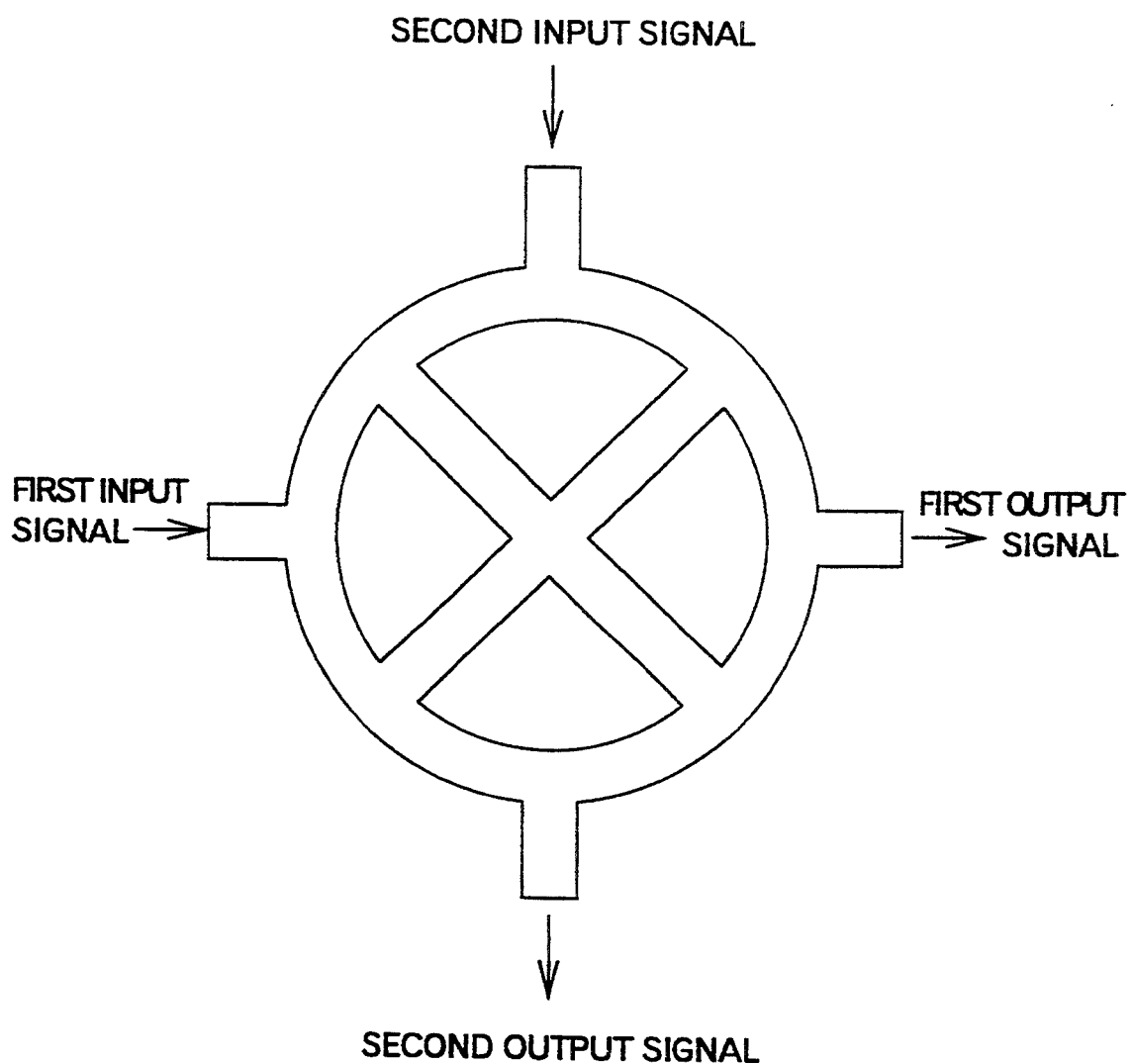
FIG. 3 is a plan view of the cross circuit in FIG. 2.

Thus, the cross circuit of the present invention is constructed such that all lines between two adjacent nodes are of a quarter-wavelength. As a result, the first and second input signals of the same frequency applied to the first and the second input nodes IN1 and IN2 appear on only the first and second output nodes O1 and O2, respectively. Therefore, the cross circuit in FIG. 2 enables two strip lines to cross each other on a single layer of a multilayer printed circuit. A plan view of the cross circuit as shown in FIG. 2 is illustrated in FIG. 3.

Figure 4:
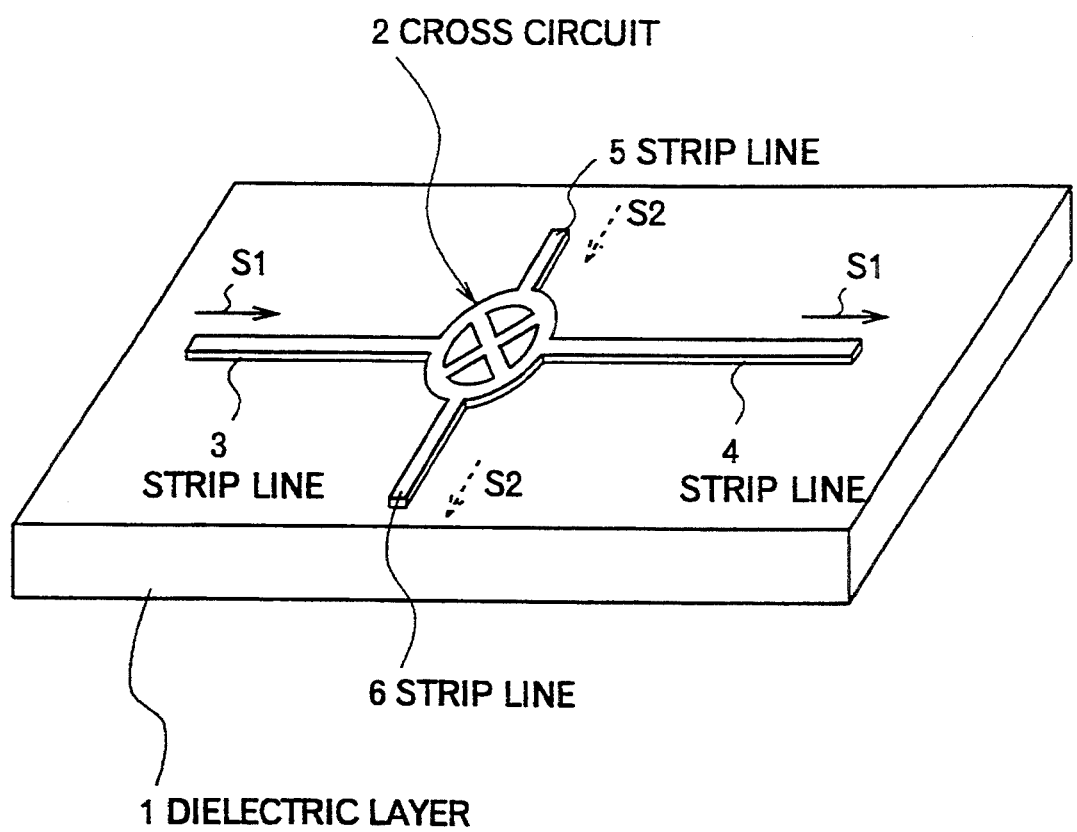
FIG. 4 is a schematic perspective view showing four lines interconnected by the cross circuit of FIG. 3.

Referring to FIG. 4, four strip lines 3–6 are interconnected by a cross circuit 2 on a dielectric layer 1 of a multilayer printed circuit board. The cross circuit 2 has a lattice structure as shown in FIG. 3. An input signal S1 passing through a strip line 3 is transmitted to only a strip line 4, and a input signal S2 passing through a strip line 5 is transmitted to only a strip line 6.

Since the cross circuit 2 has a plurality of discontinuous nodes, it is desirable to employ thinner lines and dielectric of lower loss to remove various influences of high frequencies in the dielectric layer 1 on the multilayer board.

Figure 5:
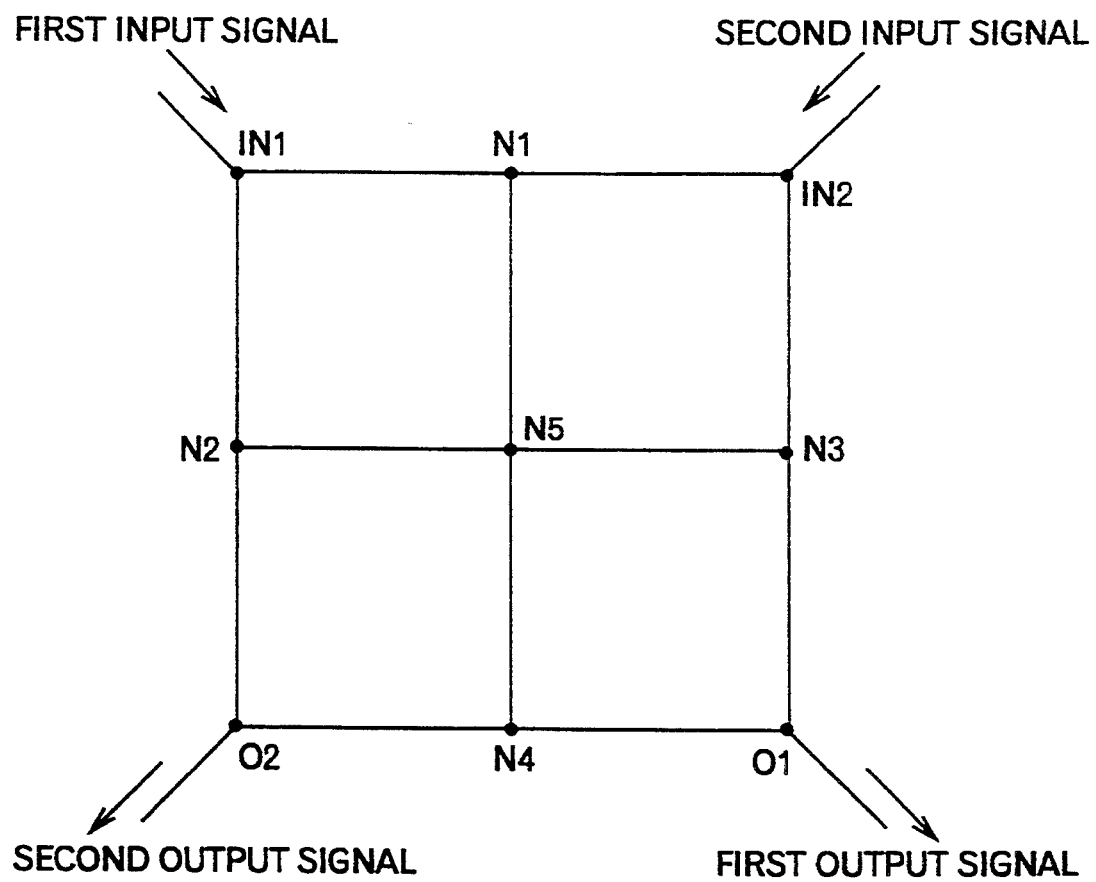
FIG. 5 is a schematic diagram showing a cross circuit according to another embodiment of the present invention.

The present invention is not limited to the shape as shown in FIG. 2 but is applicable to other shapes in which all of nodes are interconnected by quarter-wavelength lines. For example, the shape as shown in FIG. 5 also falls into the scope of the present invention.

In a cross circuit having a lattice structure according to the present invention, any two adjacent nodes are interconnected by a quarter-wavelength line. Employing such a lattice structure, there can be realized the directional coupling wherein a first input signal applied to a first input node appears on only a first output node, and a second input signal applied to a second input node appears on only a second output node. Accordingly, it becomes possible to cross two strip lines on a single layer, so it is not necessary to bypass the other line to different layers. Consequently, the number of layers of a multilayer printed circuit board is not increased and wiring becomes easy. Moreover, the efficiency of wiring per layer is enhanced.

While the subject invention has been described with relation to the preferred embodiments, various modifications and adaptations thereof will now be apparent to those skilled in the art.

I claim:

1. A cross circuit for crossing two strip lines through which respective signals of a predetermined wavelength are transmitted, the cross circuit comprising an arrangement wherein two input nodes and two output nodes are placed at regular intervals at a predetermined distance from a center node, and four nodes are placed at regular intervals at a quarter-wavelength distance from the center node, an input node is connected to each of a first node and a second node by a quarter-wavelength line, and the other input node is connected to each of the first node and a third node by a quarter-wavelength line;

an output node is connected to each of the third node and a fourth node by a quarter-wavelength line, and the other output node is connected to each of the fourth node and the second node by a quarter-wavelength line; and the center node is connected to each of the four nodes by a quarter-wavelength line.

2. The cross circuit as set forth in claim 1, wherein the arrangement is formed on a single dielectric layer.

3. The cross circuit as set forth in claim 2, wherein the arrangement is formed on an inner single layer of a multilayer printed circuit.

4. A circuit pattern comprising two input nodes and two output nodes, the pattern further comprising an arrangement wherein:

the first input node is connected to a first node by a quarter-wavelength line, and the first node is connected to the second input node by a quarter-wavelength line;

the first input node is further connected to a second node by a quarter-wavelength line, and the second node is connected to the second output node by a quarter-wavelength line;

the second input node is connected to a third node by a quarter-wavelength line, and the third node is connected to the first output node by a quarter-wavelength line;

the first output node is connected to a fourth node by a quarter-wavelength line, and the fourth node is connected to the second output node by a quarter-wavelength line;

the first node is connected to a fifth node by a quarter-wavelength line, and the fifth node is connected to the fourth node by a quarter-wavelength line; and the second node is connected to the fifth node by a quarter-wavelength line, and the fifth node is connected to the third node by a quarter-wavelength line.

5. The pattern as set forth in claim 4, wherein the arrangement is formed on a single dielectric layer.

6. The pattern as set forth in claim 5, wherein the arrangement is formed on an inner single layer of a multilayer printed circuit.

* * * * *